United States Patent
Baek et al.

(10) Patent No.: US 11,515,509 B2
(45) Date of Patent: Nov. 29, 2022

(54) VIRTUAL IMAGE DISPLAY DEVICE AND HEAD-MOUNTED DEVICE

(71) Applicant: Samsung Display Co., LTD., Yongin-si (KR)

(72) Inventors: Soomin Baek, Hwaseong-si (KR); Jaejoong Kwon, Suwon-si (KR); Jiwon Lee, Hwaseong-si (KR); SuJung Huh, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 0 days.

(21) Appl. No.: 16/802,540

(22) Filed: Feb. 26, 2020

(65) Prior Publication Data
US 2020/0295308 A1    Sep. 17, 2020

(30) Foreign Application Priority Data
Mar. 12, 2019 (KR) .................. 10-2019-0028411

(51) Int. Cl.
H01L 51/52    (2006.01)
G06F 1/16     (2006.01)
H01L 27/32    (2006.01)

(52) U.S. Cl.
CPC .......... H01L 51/5275 (2013.01); G06F 1/163 (2013.01); H01L 27/3244 (2013.01); H01L 51/5246 (2013.01); H01L 51/5253 (2013.01)

(58) Field of Classification Search
CPC ............. H01L 51/5275; H01L 51/5246; H01L 51/5253; H01L 27/3244; G06F 1/163

USPC .......................................................... 257/40
See application file for complete search history.

(56) References Cited

U.S. PATENT DOCUMENTS

| | | | |
|---|---|---|---|
| 2012/0223873 A1* | 9/2012 | Ohta ................. | H01L 51/524 345/76 |
| 2015/0042926 A1* | 2/2015 | Akasaka ........... | G02F 1/133526 349/95 |
| 2015/0048333 A1* | 2/2015 | Choi .................. | H01L 51/5275 257/40 |
| 2015/0103338 A1* | 4/2015 | Kim .................. | H01L 51/5265 356/237.1 |
| 2016/0109752 A1* | 4/2016 | Tateno .............. | G02B 3/0056 349/5 |
| 2016/0205383 A1 | 7/2016 | Hamagishi et al. | |
| 2018/0149871 A1* | 5/2018 | Chuang ............ | G02B 27/0172 |
| 2018/0267358 A1* | 9/2018 | Choi ................. | G02F 1/136286 |
| 2018/0275406 A1 | 9/2018 | Kwon et al. | |
| 2020/0119310 A1 | 4/2020 | Huh et al. | |

FOREIGN PATENT DOCUMENTS

| | | |
|---|---|---|
| KR | 10-2016-0087463 | 7/2016 |
| KR | 10-2018-0013591 | 2/2018 |
| KR | 10-2018-0107811 | 10/2018 |
| KR | 10-2020-0042582 | 4/2020 |

* cited by examiner

*Primary Examiner* — Dzung Tran
(74) *Attorney, Agent, or Firm* — H.C. Park & Associates, PLC

(57) ABSTRACT

A virtual image display device including a display panel including a plurality of pixels and configured to display an image, a window disposed on the display panel, and a multi-viewpoint layer provided between the display panel and the window, and including a plurality of lenses.

10 Claims, 15 Drawing Sheets

VIRTUAL IMAGE DISPLAY DEVICE AND HEAD-MOUNTED DEVICE

CROSS REFERENCE TO RELATED APPLICATION

This application claims priority from and the benefit of Korean Patent Application No. 10-2019-0028411, filed on Mar. 12, 2019, which is hereby incorporated by reference for all purposes as if fully set forth herein.

BACKGROUND

Field

Exemplary embodiments of the invention relate generally to a virtual image display device and a head-mounted device, and, more specifically, to a virtual image display device for providing a virtual image and a head-mounted device having the same.

Discussion of the Background

A head-mounted device is a device mounted on the head of a user and is a media device for providing to a user augmented reality or virtual reality. The head-mounted device for implementing virtual reality may provide a virtual image through a display device. In this case, a user may view the virtual image and a real object at the same time. In order to implement the virtual reality, the head-mounted device is provided with a display device and a lens module. A lens module allows a user to view an enlarged virtual image by enlarging an image output from the display device and displaying the enlarged virtual image on a virtual surface.

The above information disclosed in this Background section is only for understanding of the background of the inventive concepts, and, therefore, it may contain information that does not constitute prior art.

SUMMARY

Exemplary embodiments of the invention provide a virtual image display device capable of reducing an entire thickness of a head-mounted device and improving the quality of a virtual image, and the head-mounted device employing the same.

Additional features of the inventive concepts will be set forth in the description which follows, and in part will be apparent from the description, or may be learned by practice of the inventive concepts.

An exemplary embodiment of the invention provides a virtual image display device including: a display panel including a plurality of pixels and configured to display an image; a window disposed on the display panel; and a multi-viewpoint layer provided between the display panel and the window, and including a plurality of lenses.

The display panel may include a plurality of pixel areas in which a plurality of pixels are respectively disposed, and non-pixel areas disposed between the plurality of pixel areas, wherein the plurality of lenses are disposed to correspond to the plurality of pixel areas, respectively.

Each of the plurality of pixel areas may include: a light emission area; and a non-light emission area adjacent to the light emission area, wherein each of the plurality of lenses is disposed in the light emission area of a corresponding pixel.

Each of the plurality of pixels may include an organic light emitting element including a light emission layer disposed to correspond to the light emission area.

The display panel may further include a thin-film encapsulation layer covering the plurality of pixels, wherein the multi-viewpoint layer is disposed on a top surface of the thin-film encapsulation layer.

A distance between a lens and a pixel corresponding to each other may be in a range of about 10 µm to about 450 µm.

Each of the plurality of lenses may have a height in a range of about 1 µm to about 20 µm.

Each of the plurality of lenses may have a pitch smaller than a size of each of the plurality of pixels.

Each of the plurality of lenses may have a radius of curvature in a range of about 5 to about 20.

The multi-viewpoint layer may include a plurality of viewpoint units, wherein each of the plurality of viewpoint units includes N lenses among the plurality of lenses, where N is an integer greater than 2.

The N lenses may include a reference lens and (N-1) peripheral lenses, and a center point of the reference lens may match a center point of a reference pixel corresponding to the reference lens Center points of the (N-1) peripheral lenses may be disposed at different positions from center points of peripheral pixels respectively corresponding to the (N-1) peripheral lenses.

The virtual image display device may further include an adhesive layer disposed between the multi-viewpoint layer and the window.

The virtual image display device may further include at least one of a functional layer and a protection layer between the multi-viewpoint layer and the window.

Another exemplary embodiment of the invention provides a virtual image display device including: a display panel including a plurality of pixels and configured to display an image; and a multi-viewpoint layer disposed on the display panel and including a plurality of lenses respectively corresponding to the plurality of pixels. The display panel includes a plurality of pixel areas in which the plurality of pixels are respectively disposed, and each of the plurality of pixel areas includes: a light emission area; and a non-light emission area adjacent to the light emission area, wherein each of the plurality of lenses is disposed in the light emission area of a corresponding pixel.

The display panel may further include a thin-film encapsulation layer configured to cover the plurality of pixels, wherein the multi-viewpoint layer is disposed on a top surface of the thin-film encapsulation layer.

A distance between a lens and a pixel corresponding to each other may be in a range of about 10 µm to about 450 µm.

Another exemplary embodiment of the invention provides a head-mounted device including: a virtual image display device including a display panel having a plurality of pixels and configured to display an image, and a multi-viewpoint layer disposed on the display panel and including a plurality of lenses; a frame in which a seating space in which the virtual image display device is mounted is provided; and a wearing unit connected to the frame and worn on the head of a user. A distance between an eye of the user and the virtual image display device is less than or equal to about 35 mm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
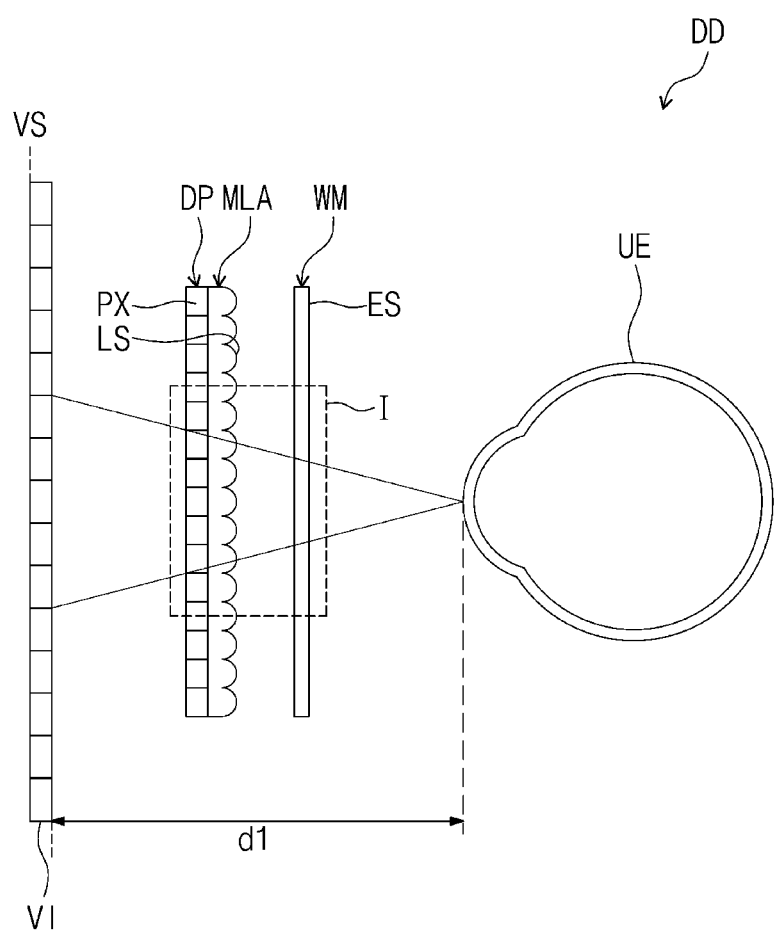
FIG. 1 illustrates a virtual image display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the accompanying drawings.

Figure 2:
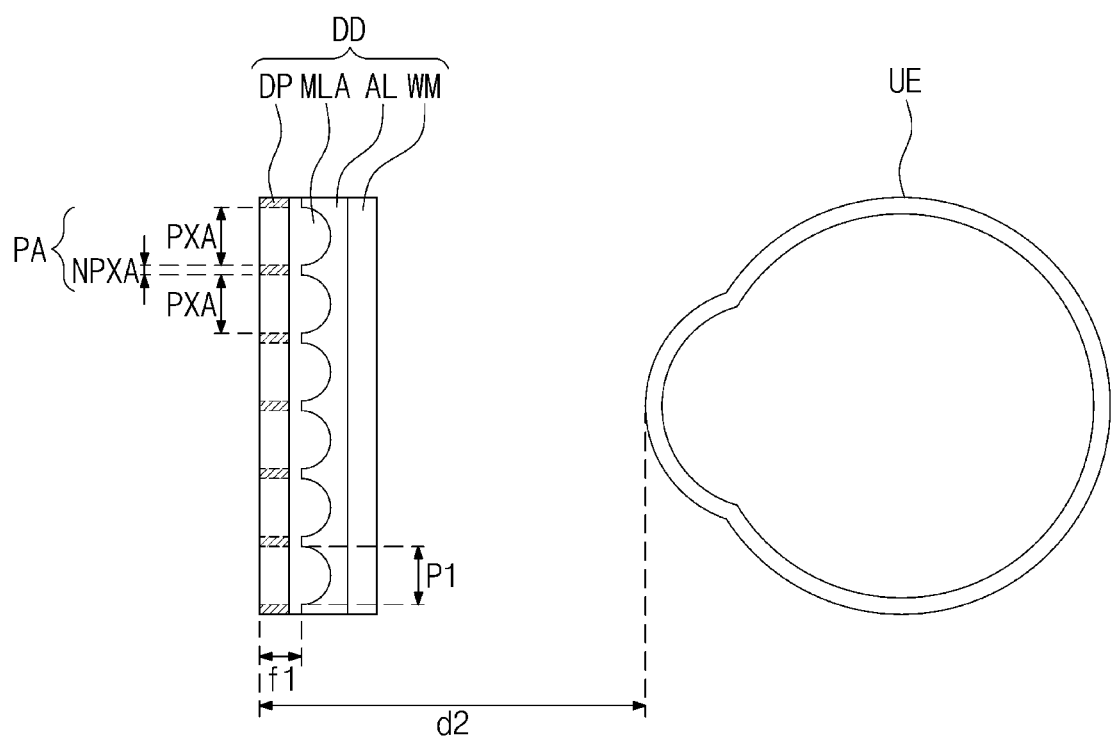
FIG. 2 is an enlarged view of part I illustrated in FIG. 1.

FIG. 1 illustrates a virtual image display device according to an exemplary embodiment of the invention, and FIG. 2 is an enlarged view of part I illustrated in FIG. 1.

Referring to FIGS. 1 and 2, a virtual image display device DD includes a display panel DP, a window WM, and a multi-viewpoint layer MLA.

The display panel DP may be a rigid display panel or a flexible display panel. For the flexible display panel, the shape may be modified by an operation of bending, folding, rolling, or the like. As an example of the inventive concepts, the display panel DP may include an organic light emitting element. The display panel DP is disposed close to the eye UE of a user to display an image.

The display panel DP may include a plurality of pixels PX, each of which is a minimum unit configured to display an image. The display panel DP includes a plurality of pixel areas PA, in which a plurality of pixels PX are respectively disposed.

The window WM is provided on the display panel DP to define an emission surface of the display device, from which an image is output. The window WM may be optically transparent. Accordingly, an image generated in the display panel DP may pass the window WM.

The multi-viewpoint layer MLA may be disposed between the display panel DP and the window WM. As an example of the inventive concepts, the multi-viewpoint layer MLA is displaced between the plurality of pixels PX and the window WM. The multi-viewpoint layer MLA may include a plurality of lenses LS respectively corresponding to the plurality of pixels PX.

The plurality of lenses LS enlarges an image output from the corresponding pixels PX to project the enlarged image onto a virtual surface VS. Accordingly, by means of the multi-viewpoint layer MLA, the user may view a virtual image VI projected onto the virtual surface VS separated by a certain distance d1 from the eye UE of the user. In detail, an image output from each pixel PX is enlarged by a corresponding lens to be incident to the crystalline lens of the eye UE of the user, and then focused onto the retina by the crystalline lens. Accordingly, the eye UE of the user visually sense the virtual image VI projected onto the virtual surface VS.

As illustrated in FIG. 2, each pixel area PA of the display panel DP may include a light emission area PXA and a non-light emission area NPXA. The light emission area PXA is an area in which a light emission layer from which light is actually output is disposed, and the non-light emission area NPXA is a light shield area that is adjacent to the light emission area PXA and a light shielding material, such as a black matrix, is disposed therein.

A plurality of lenses LS may be disposed in correspondence to the plurality of pixel areas PA, respectively. In other words, each of the plurality of lenses LS may be disposed to overlap the light emission area PXA and the non-light emission area NPXA of the corresponding pixel area PA. As illustrated in FIG. 2, each of the plurality of lenses LS may be disposed in the light emission area PXA in the corresponding pixel area PA.

Each of the plurality of lenses LS may be designed to have a focal point to be focused onto a corresponding pixel PX. Each pitch P1 of the plurality of lens LS according to an example of the inventive concepts may have the size corresponding to the pixel area PA. In addition, each focal point of the lenses LS may be focused onto a corresponding pixel PX by adjusting the radius of curvature and the height of each of the lenses LS. Each of the lenses LS may have a radius of curvature in a range of about 1 µm to about 20 µm.

Here, the multi-viewpoint layer MLA may be directly provided on the display panel DP. In other words, the multi-viewpoint layer MLA may be provided on the uppermost surface of the display panel DP through a consecutive process.

The window WM may be disposed on the multi-viewpoint layer MLA. An adhesion layer AL may be disposed between the multi-viewpoint layer MLA and the window WM so as to combine them. A functional layer and a protection layer may be additionally disposed between the multi-viewpoint layer MLA and the window WM.

In this way, the multi-viewpoint layer MLA may be directly provided on the display panel DP, and thus, each size of the lenses LS provided on the multi-viewpoint layer MLA may be reduced to a pixel size. In addition, as the sizes of the lenses LS become reduced, a distance (namely, a focal length) f1 between the lenses LS and the pixel PX is reduced. As an example of the inventive concepts, the distance f1 between the lenses LS and the pixel PX may be in a range of about 10 µm to about 450 µm. Accordingly, a distance d2 between the pixel PX of the display panel DP and the eye UE of the user may be reduced. In other words, the distance d2 between the pixel PX of the display panel DP and the eye UE of the user may be reduced to about 35 mm or smaller. Accordingly, the entire thickness of a head-mounted device, which employs the virtual image display device DD, may be reduced.

In addition, each of the plurality of lenses LS may be disposed to correspond to a light emission area PXA in a corresponding pixel area PA. Accordingly, when each of the lenses LS is provided to the non-light emission area NPXA, an image output from the pixel PX may be enlarged to the non-light emission area NPXA to generate a screen door effect in which the non-light emission area NPXA is viewed by the eye UE of the user. However, each of the lenses LS according to the inventive concepts is disposed to correspond to the light emission area PXA to prevent a phenomenon in which the non-light emission area NPXA is viewed as enlarged, and thereby improves the quality of the image.

Figure 3:
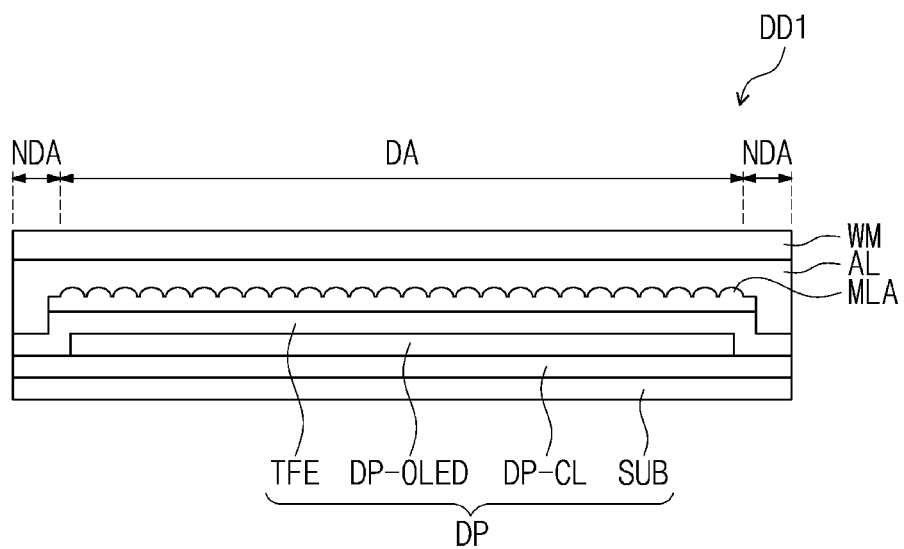
FIG. 3 is a cross-sectional view showing the virtual image display device illustrated in FIG. 1.
Figure 4:
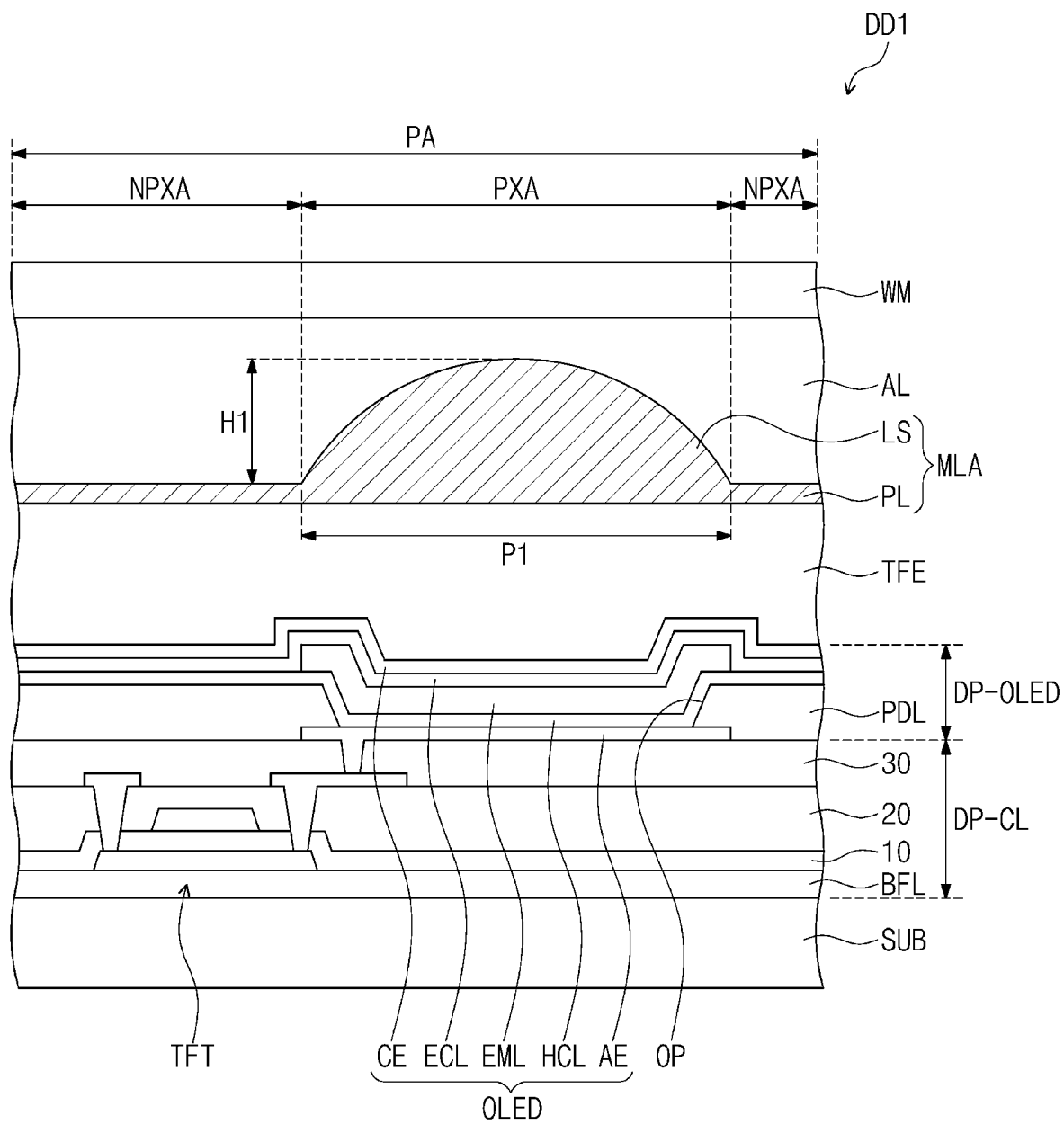
FIG. 4 is an enlarged cross-sectional view of the virtual image display device illustrated in FIG. 3.
Figure 5:
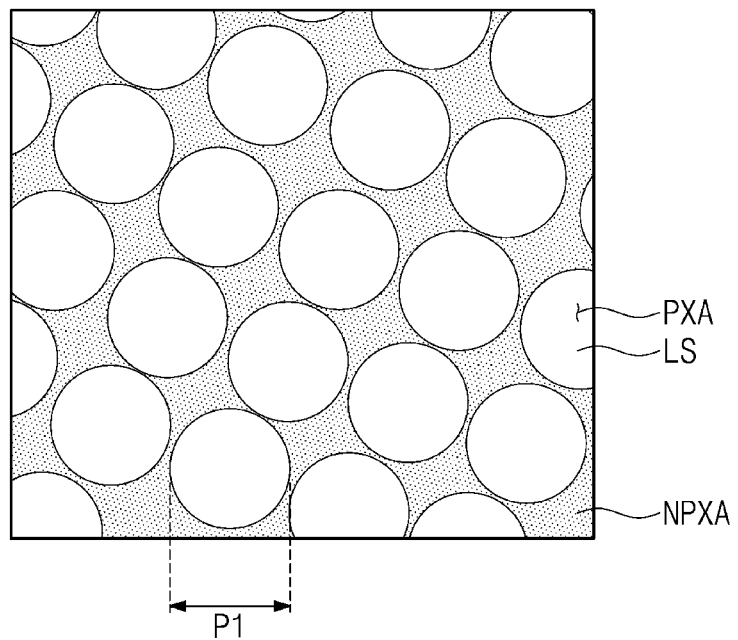
FIG. 5 is a plan view showing a multi-viewpoint layer illustrated in FIG. 3.

FIG. 3 is a cross-sectional view showing the virtual image display device illustrated in FIG. 1; FIG. 4 is an enlarged cross-sectional view of the virtual image display device illustrated in FIG. 3; and FIG. 5 is a plan view showing the multi-viewpoint layer illustrated in FIG. 3.

Referring to FIG. 3, a virtual image display device DD1 includes a display panel DP, a window WM, and a multi-viewpoint layer MLA.

A display area DA and a non-display area NDA may be defined in the virtual image display device DD1. The display area DA is an area on which an image is displayed. The non-display area NDA is adjacent to the display area DA, and an image is not displayed thereon. The non-display area NDA may surround the display area DA. However, this is only exemplary, and the non-display area NDA may be adjacent to a part of the edge of the display area DA.

The display panel DP includes a base layer SUB, a circuit layer DP-CL disposed on the base layer SUB, a display element layer DP-OLED, and a thin-film encapsulation layer TFE. The base layer SUB may include at least one plastic film. The base layer SUB is a flexible substrate and may include a plastic substrate, a glass substrate, a metal substrate, or an organic/inorganic composite material, etc.

The circuit layer DP-CL may include at least one intermediate insulation layer, a plurality of conductive layers, and a semiconductor layer. The plurality of conductive layers of the circuit layer DP-CL may constitute signal lines and a pixel circuit. The pixel circuit may include thin-film transistors and a capacitor.

The display element layer DP-OLED is disposed on the circuit layer DP-CL. For example, the display element layer DP-OLED may be disposed to correspond to the display area DA. The display element layer DP-OLED may include a display element, for example, an organic light emitting diode.

The thin film encapsulation layer TFE is directly formed on the display element layer DP-OLED, or directly formed on a functional layer disposed on the display element layer DP-OLED. The thin film encapsulation layer TFE may be manufactured through a consecutive process with the display element layer DP-OLED.

The thin-film encapsulation layer TFE may include at least one inorganic layer and at least one organic layer. The inorganic layer protects the display element layer DP-OLED from moisture/oxygen, and the organic layer protects the display element layer DP-OLED from a foreign material, such as dust particles.

As illustrated in FIG. 4, the circuit layer DP-CL is disposed on the base layer SUB. The circuit layer DP-CL may include a plurality of insulation layers BFL, 10, 20, and 30, and a thin film transistor TFT. Each of the plurality of insulation layers BFL, 10, 20, and 30 may include an organic material and/or inorganic material, and have a single layer or multi-layer structure. Some parts, such as, for example, a buffer layer BFL, of the plurality of insulation layers BFL, 10, 20, and 30 may be omitted entirely, or another insulation layer may be further disposed.

The display element layer DP-OLED is disposed on the circuit layer DP-CL. The display element layer DP-OLED may include a pixel definition layer PDL and an organic light emitting diode OLED. Each pixel area PA of the display panel DP may be divided into a light emission area PXA in which the organic light emitting diode OLED is disposed on a plane, and a non-light emission area NPXA adjacent thereto. The opening part OP of the pixel definition layer PDL exposes at least a part of the first electrode AE. The opening part OP of the pixel definition layer PDL may correspond to the light emission area PXA.

The organic light emitting element OLED may include a first electrode AE, a second electrode CE, and an emission function layer disposed between the first electrode AE and the second electrode CE. In the present exemplary embodiment, the organic light emitting diode OLED of a top emission structure in which light is emitted toward the second electrode CE will be illustratively described. The second electrode CE is disposed to be more adjacent to the thin film encapsulation layer TFE than to the first electrode AE.

In FIG. 4, the emission function layer includes a first charge control layer HCL, an emission layer EML, and a second charge control layer ECL, but the laminated structure of the emission function layer is not limited thereto. The emission layer EML may include an organic light emission material in which a host and a dopant are mixed, and/or an inorganic light emission material, such as semiconductor nano-crystal (e.g., quantum dot, quantum rod, or quantum tube). Each of the first charge control layer HCL and the second charge control layer ECL injects and/or transports a corresponding charge between an electron and a hole. Although not shown separately, the emission function layer and the second electrode CE may be commonly disposed in the plurality of light emission areas PXA and the non-light emission areas NPXA adjacent thereto.

The first electrode AE may include a reflective layer. For example, the reflective layer may include at least any one selected from the group including silver (Ag), magnesium (Mg), aluminum (Al), platinum (Pt), palladium (Pd), gold (Au), nickel (Ni), neodymium (Nd), iridium (Ir), and chromium (Cr). The first electrode AE may further include a transparent layer or a semi-transparent layer formed with at least any one selected from a group including indium tin oxide (ITO), indium zinc oxide (IZO), zinc oxide (ZnO), indium oxide ($In_2O_3$), indium gallium oxide (IGO) and aluminum zinc oxide (AZO). In the present exemplary embodiment, the first electrode AE may include three layers of indium tin oxide (ITO)/silver (Ag)/indium tin oxide (ITO).

The second electrode CE may include a conductive material of a small absorption ratio and a high reflection ratio. The second electrode CE may be a semi-transparent electrode so as to form a resonance structure with the first electrode AE. The second electrode CE may include a conductive material in which the multiplication of a refractive ratio and an extinction ratio is in a range of about 1 to about 10 in the visible region. For example, the second electrode CE may include one or more materials selected from among silver (Ag), aluminum (Al), ytterbium (Yb), titanium (Ti), magnesium (Mg), Nickel (Ni), lithium (Li), calcium (Ca), copper (Cu), LiF/Ca, LiF/A1, MgAg or CaAg.

The multi-viewpoint layer MLA is provided on the thin-film encapsulation layer TFE. The multi-viewpoint layer MLA includes a planarization layer PL, and a lens layer protruding from the top surface of the planarization layer PL. The lens layer may include a plurality of lenses LS. The plurality of lenses LS may be spaced apart from each other. In other words, the plurality of lenses LS may be spaced apart from each other by a prescribed interval, and connected by the planarization layer PL. Each of the plurality of lenses LS may be disposed to correspond to the light emission area PXA in the pixel area PA. Each of the plurality of lenses LS may overlap the light emission area PXA. The planarization layer PL may entirely cover the light emission area PXA and the non-light emission area NPXA of the pixel area PA.

FIG. 4 illustrates a structure in which the multi-viewpoint layer MLA includes the planarization layer PL, and the plurality of lenses LS are connected by the planarization layer PL, but the structure of the multi-viewpoint layer MLA is not limited thereto. In other words, as another example of the inventive concepts, the planarization layer PL may be omitted in the multi-viewpoint layer MLA, and the plurality of lenses LS are directly formed on the thin-film encapsulation layer TFE.

Each of the plurality of lenses LS may have a convex lens shape convexly protruding from the top surface of the planarization layer PL or the top surface of the thin-film encapsulation layer TFE. As illustrated in FIG. 5, each of the plurality of lenses LS may have a circular shape when viewed in a plan view. In other words, each of the plurality of lenses LS may have a protruding shape in a semispherical type. However, the shape of the lenses LS is not limited thereto. For example, each of the plurality of lenses LS may have a polygonal or elliptical shape in a plan view.

In addition, the lenses LS in FIG. 5 are illustrated to have the same size. However, in another example, the lenses LS may have different sizes.

The multi-viewpoint layer MLA may be formed of an acrylic resin or the like, and formed on the thin-film encapsulation layer TFE through a photo process or an imprinting process.

Each of the plurality of lenses LS may have the height H1 in a range of about 1 μm to about 20 μm. When each lens LS is disposed to correspond to the light emission area PXA, the pitch P1 of each lens LS may be less than the width of each pixel area PA. The pitch P1 of the lens LS may be greater than the width of the light emission area PXA of each pixel area PA, and may be set to 1 μm or greater. The radius of curvature of each of the plurality of lenses LS may be in a range of about 5 μm to about 20 μm.

The virtual image display device DD1 further includes the window WM disposed on the multi-viewpoint layer MLA. The window WM may include a glass substrate, a sapphire substrate, a plastic substrate, or the like. The window WM may have a multiplayer or single layer structure. For example, the window WM may include a plurality of plastic films combined with an adhesive. The window WM may further include a bezel layer disposed in correspondence to the non-display area NDA (see FIG. 3). The bezel layer may include an organic mixture including a black pigment or a black dye. The bezel layer may be formed in a manner of deposition, printing, coating, or the like. Although not illustrated separately, the window WM may further include a functional coating layer. The functional coating layer may include an anti-fingerprint layer, an anti-reflection layer, and a hard coating layer.

The virtual image display device DD1 may further include an adhesive layer AL disposed between the window WM and the multi-viewpoint layer MLA. The adhesive layer AL combines the window WM and the display panel DP. The adhesive layer AL may be an Optically Clear Adhesive film (OCA), an Optically Clear Resin (OCR), or a Pressure Sensitive Adhesive film (PSA).

Figure 6:
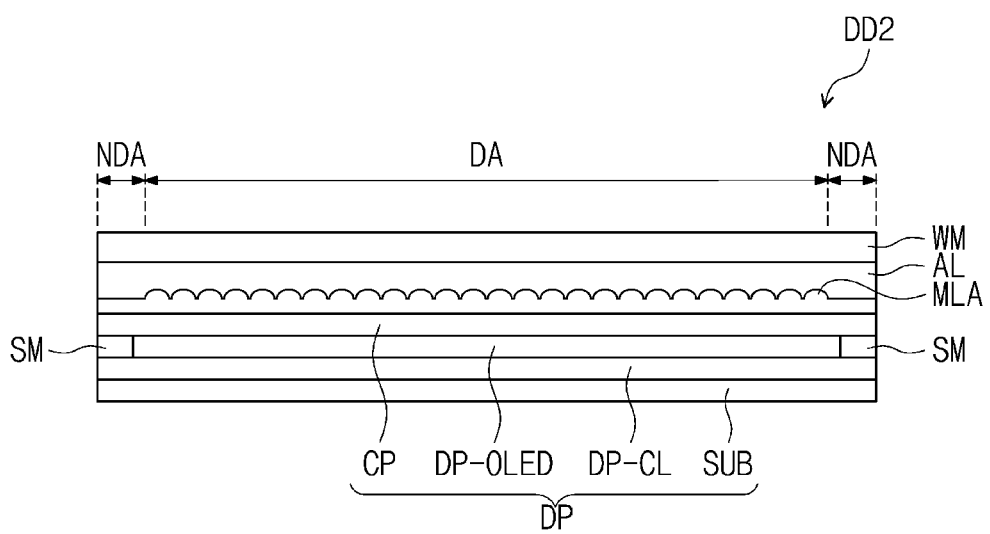
FIG. 6 is a cross-sectional view illustrating a virtual image display device according to an exemplary embodiment of the invention.
Figure 7:
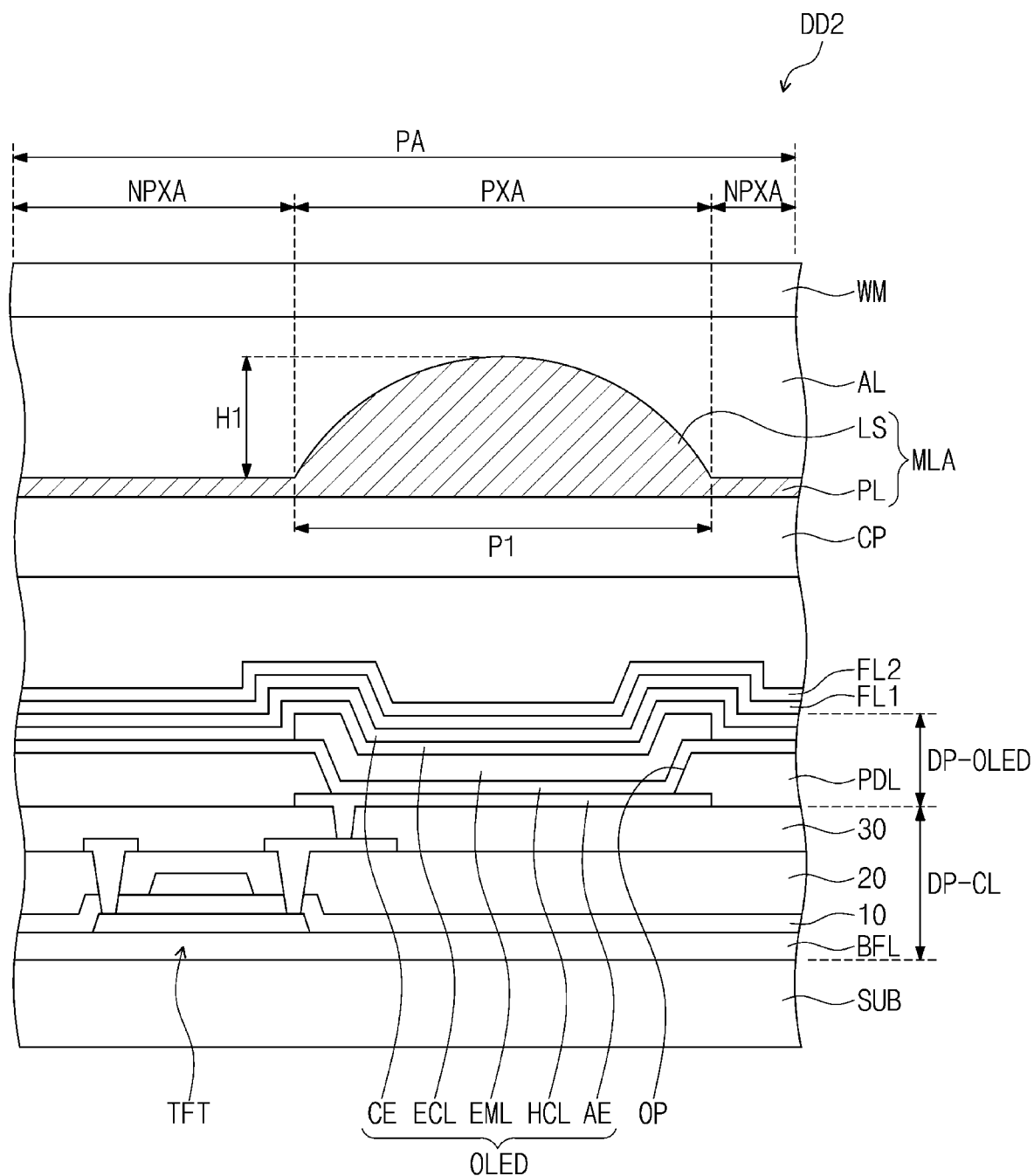
FIG. 7 is an enlarged cross-sectional view of the virtual image display device illustrated in FIG. 6.

FIG. 6 is a cross-sectional view illustrating a virtual image display device according to an exemplary embodiment of the invention; and FIG. 7 is an enlarged cross-sectional view of the virtual image display device illustrated in FIG. 6.

With reference to FIGS. 6 and 7, in a virtual image display device DD2 according to an exemplary embodiment of the invention, a display panel DP may include a base layer SUB, a circuit layer DP-CL disposed on the base layer SUB, a display element layer DP-OLED, an encapsulation plate CP, and a sealing layer SM.

The encapsulation plate CP encapsulates a display element layer DP-OLED. The encapsulation plate CP may include a plastic substrate and/or a glass substrate. The encapsulation plate CP and the circuit layer DP-CL may be combined through the sealing layer SM disposed in a non-display area NDA in which an image is not generated. In the present exemplary embodiment, the display element layer DP-OLED is disposed only in a display area DA, but a display element layer DP-OLED may be further disposed in a part of a non-display area NDA. At this point, the sealing layer SM may combine the circuit layer DP-CL, the display element layer DP-OLED, and the encapsulation plate CP.

As illustrated in FIG. 7, the encapsulation plate CP may be disposed to be separate from the display element layer DP-OLED. In addition, a material having a prescribed refractive index may be disposed between the encapsulation plate CP and the display element layer DP-OLED. The material may be the air or a sealing material.

In addition, the display panel DP may further include functional layers FL1 and FL2 disposed on the display element layer DP-OLED. The functional layers FL1 and FL2 in FIG. 7 include a first functional layer FL1 disposed on the second electrode CE and a second functional layer FL2 disposed on the first functional layer FL1.

The first functional layer FL1 may be an input sensing layer that senses an external input. The input sensing layer FL1 may sense various type inputs provided outside the virtual image display device DD2. For example, the input sensing layer FL1 may sense an input through the body of a user, or sense external inputs in various types such as light, heat, pressure, or the like. In addition, the input sensing layer FL1 may sense not only an input contacting a sensing surface, but also an input proximate to the sensing surface.

The second functional layer FL2 may be an anti-reflection layer that blocks external light reflection. The anti-reflection layer FL2 may prevent a limitation that elements composing the display panel DP are viewed externally by external light incident through the top surface of the virtual image display device DD2. The anti-reflection layer FL2 may include polarization layers and/or a phase delay layer. According to the operation principle of the anti-reflection layer FL2, the number of the phase delay layers and the phase delay length ($\lambda/4$ or $\lambda/2$) of the phase delay layer may be determined.

The number of the functional layers is not limited thereto, and the functional layers may additionally include another functional layer other than the first and second functional layers FL1 and FL2, or include only one of the first and second functional layers FL1 and FL2.

Referring to FIG. 7, the multi-viewpoint layer MLA is disposed on the encapsulation plate CP. The multi-viewpoint layer MLA includes a planarization layer PL and a lens layer protruding from the top surface of the planarization layer PL. The lens layer may include a plurality of lenses LS. The plurality of lenses LS may be formed apart from each other on the planarization layer PL.

Each of the plurality of lenses LS may be disposed in correspondence to the light emission area PXA in the pixel area PA. Each of the plurality of lenses LS may overlap the light emission area PXA. The planarization layer PL may entirely cover the light emission area PXA and the non-light emission area NPXA of the pixel area PA. As another example of the inventive concepts, the planarization layer PL may be omitted from the multi-viewpoint layer MLA, and the plurality of lenses LS may be directly formed on the top surface of the encapsulation plate CP.

Each of the plurality of lenses LS may have the shape protruding convexly from the top surface of the planarization layer PL or from the top surface of encapsulation plate CP. Each of the plurality of lenses LS may have a spherically protruding shape.

The virtual image display device DD2 may further include a window WM disposed on the multi-viewpoint layer MLA and an adhesive layer AL disposed between the window WM and the multi-viewpoint layer MLA. The adhesive layer AL combines the window WM and the encapsulation plate CP.

Figure 8:
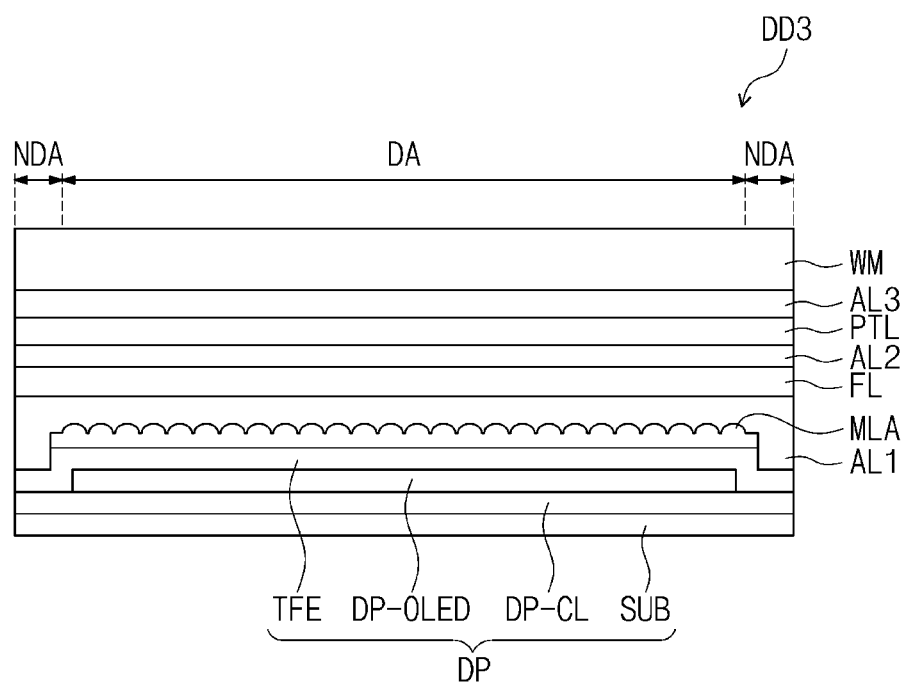
FIG. 8 a cross-sectional view illustrating a virtual image display device according to an exemplary embodiment of the invention.

FIG. 8 a cross-sectional view illustrating a virtual image display device according to an exemplary embodiment of the invention.

Referring to FIG. 8, a virtual image display device DD3 according to an embodiment of the inventive concept may include at least one functional layer FL disposed between the window WM and the multi-viewpoint layer MLA, and at least one protection layer PTL.

The functional layer FL may include any one of an input sensing layer that senses a user input (for example, a touch operation, etc.) and an anti-reflection layer that prevents reflection of external light. The protection layer PTL may be a layer for absorbing a shock applied externally to protect the display panel DP from the shock. As an example of the inventive concepts, the functional layer FL may be disposed on the multi-viewpoint layer MLA, and the protection layer PTL may be disposed on the functional layer FL.

The virtual image display device DD3 may further include first to third adhesive layers AL1, AL2, and AL3. The first adhesive layer AL1 may be intervened between the functional layer FL and the multi-viewpoint layer MLA to combine the functional layer FL and the multi-viewpoint layer MLA. The second adhesive layer AL2 may be intervened between the functional layer FL and the protection layer PTL to combine them, and the third adhesive layer AL3 may be intervened between the protection layer PTL and the window WM to combine the protection layer PL and the window WM.

Figure 9:
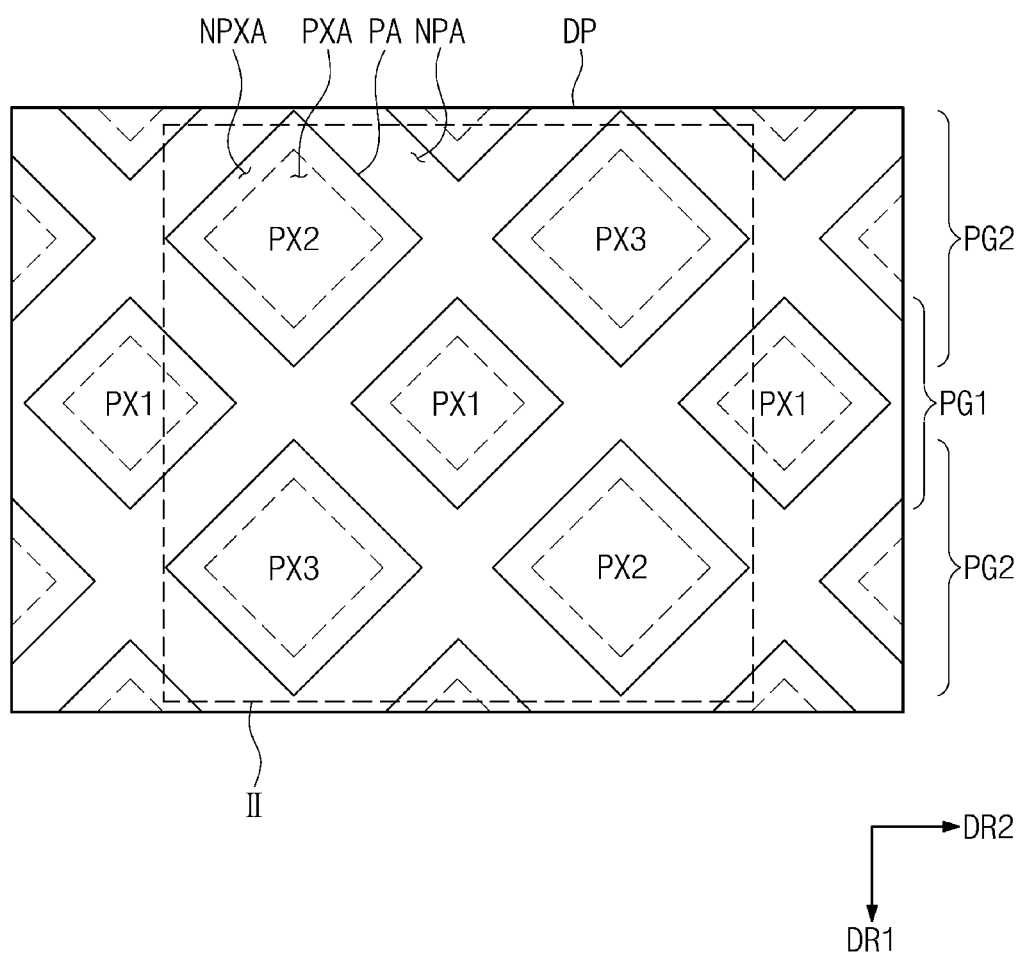
FIG. 9 is a plan view of a display panel according to an exemplary embodiment of the invention.
Figure 10:
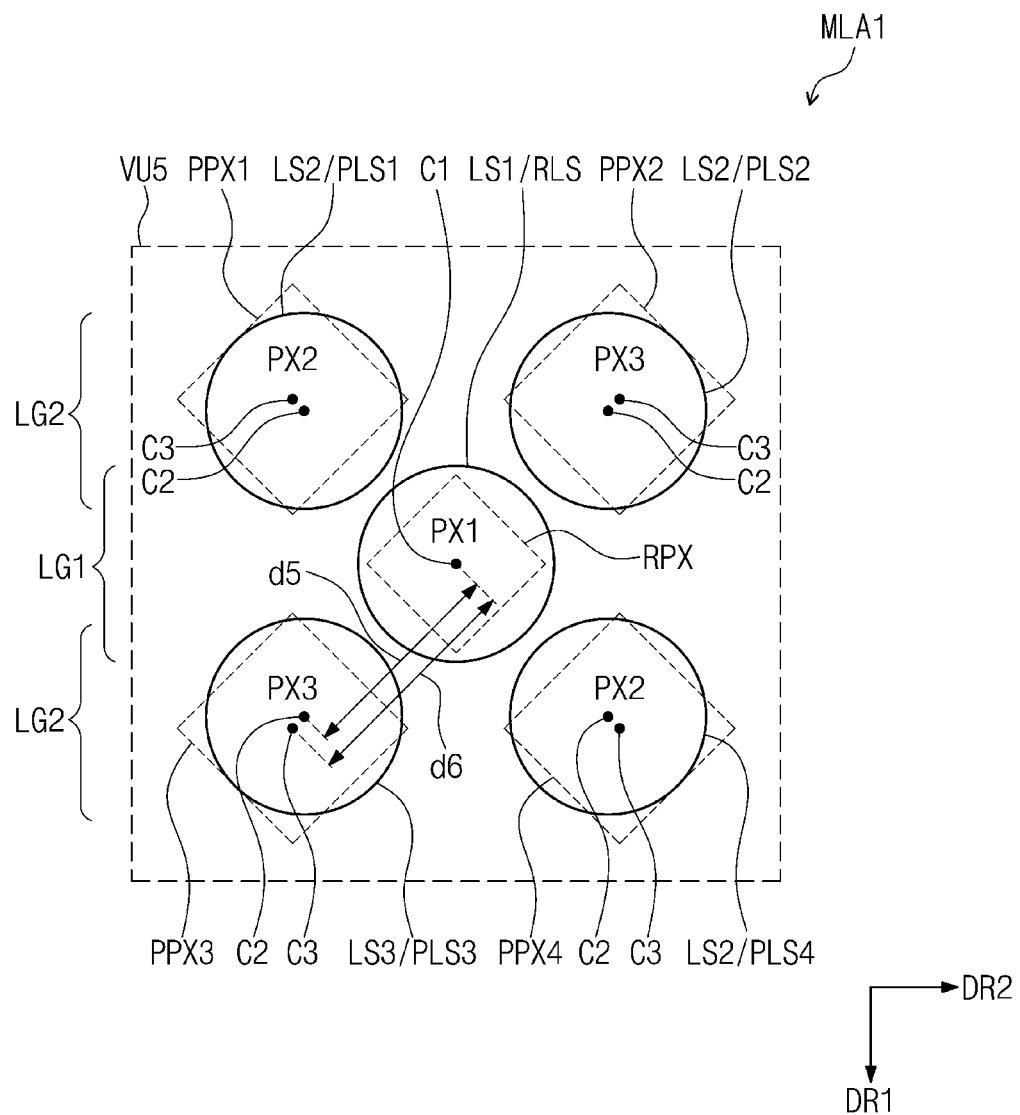
FIG. 10 is a plan view illustrating an arrangement relationship between pixels and lenses in region II illustrated in FIG. 9.
Figure 11:
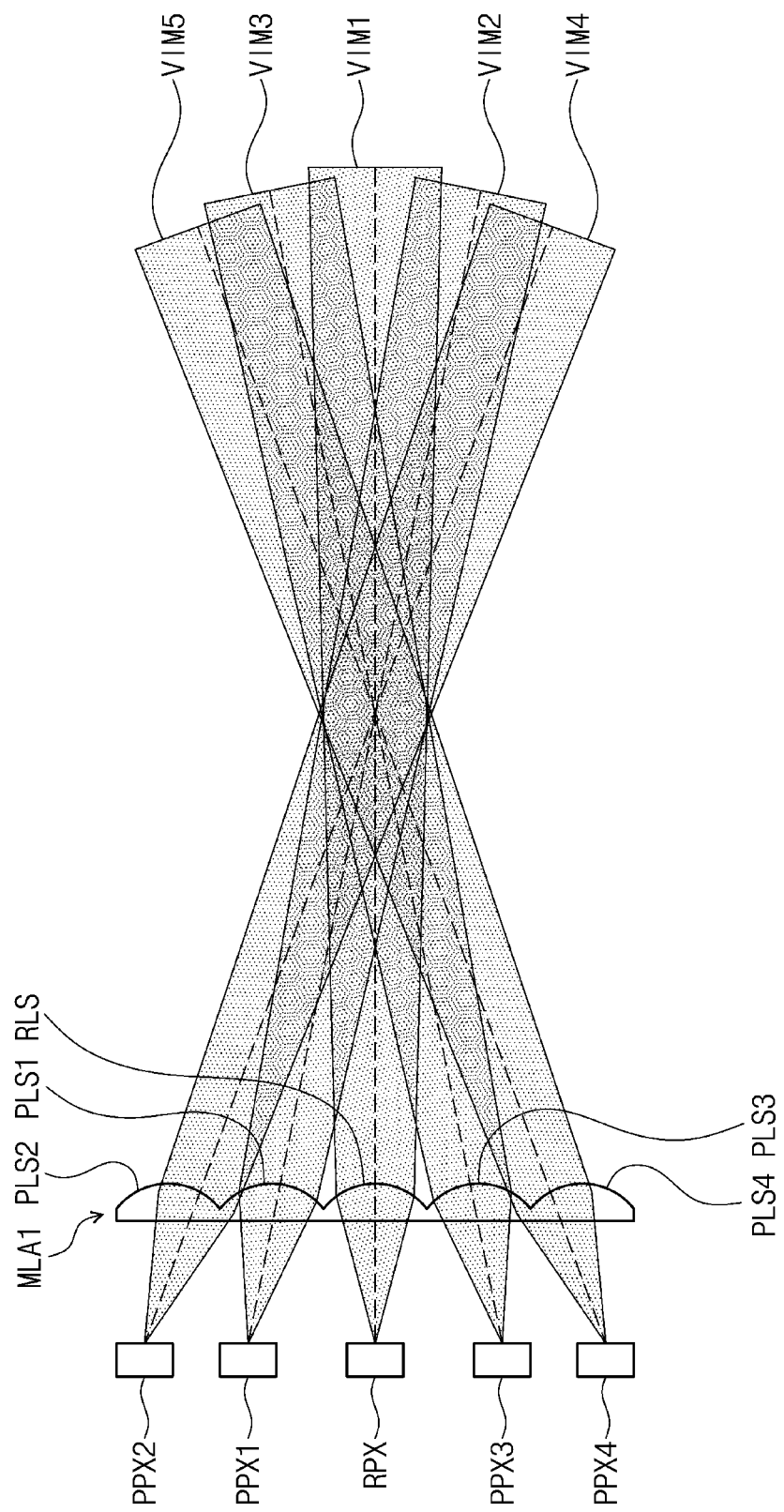
FIG. 11 illustrates an image after passing through the multi-viewpoint layer illustrated in FIG. 10.

FIG. 9 is a plan view of a display panel according to an exemplary embodiment of the invention; FIG. 10 is a plan view illustrating the arrangement relationship of pixels and lenses in region II illustrated in FIG. 9; and FIG. 11 shows an image after passing through the multi-viewpoint layer illustrated in FIG. 10.

Referring to FIG. 9, the display panel DP may include first pixel groups PG1 and second pixel groups PG2. The first pixel groups PG1 and the second pixel groups PG2 may be alternately arrayed along a first direction DR1.

The first pixel groups PG1 may include a plurality of first pixels PX1. The plurality of first pixels PX1 may be arrayed along a second direction DR2. The second pixel groups PG2 may include a plurality of second pixels PX2 and a plurality of third pixels PX3. The second pixels PX2 and the third pixels PX3 may be alternately arrayed along the second direction DR2. Non-pixel areas NPA may be defined between the first to third pixels PX1, PX2, and PX3.

The arrayed structure of the first to third pixels PX1, PX2 and PX3 illustrated in FIG. 9 is illustrated just as an example, and the inventive concepts are not limited thereto. For example, as another example of the inventive concepts, first pixels PX1, second pixels PX2, and third pixels PX3 may be alternately arranged in a stripe type along the second direction DR2. In addition, each of first to third pixels PX1, PX2 and PX3 is exemplarily illustrated to have a rectangular shape, but the inventive concepts are not limited thereto. The shape of each of the first to third pixels PX1, PX2 and PX3 may be modified in various ways such as a polygonal, circular, or elliptical shape. As another example, the shapes of the first to third pixels PX1, PX2, and PX3 may be different from each other. In other words, the first pixel PX1 may have a circular shape, and the second and third pixels PX2 and PX3 may have a rectangular shape.

In addition, FIG. 9 exemplarily illustrates that the size of the first pixel PX1 is smaller than the sizes of the second and third pixels PX2 and PX3, but the inventive concepts are not limited thereto. For example, in another exemplary embodiment of the invention, the first to third pixels PX1, PX2 and PX3 may have the same size.

As an example of the inventive concepts, the first pixels PX1 may be green pixels, the second pixels PX2 may be blue pixels, and the third pixels PX3 may be red pixels. However, the inventive concepts are not limited thereto.

Referring to FIGS. 9 and 10, the virtual image display device DD includes a multi-viewpoint layer MLA1 composed to provide 5 viewpoint images.

The multi-viewpoint layer MLA1 includes a first lens group LG1 disposed to correspond to the first pixel group PG1 and a second lens group LG2 disposed to correspond to the second pixel group PG2. The first lens group LG1 includes first lenses LS1 respectively disposed to correspond to the first pixels PX1, and the second lens group LG2 includes second lenses LS2 respectively disposed to correspond to the second pixels PX2, and third lenses LS3 respectively disposed to correspond to the third pixels PX3.

The first and second lens groups LG1 and LG2 are alternately arranged in the first direction DR1, and the second lenses LS2 and the third lenses LS3 are alternately arranged in the second direction DR2. Each of the first to third lenses LS1 to LS3 has a circular shape when viewed in a plan view.

FIG. 10 exemplarily illustrates that the sizes of the first to third lenses LS1 to LS3 are the same, but the inventive concepts are not limited thereto. For example, the size of the first lens LS1 may be smaller than those of the second and third lenses LS2 and LS3. In other words, the lenses LS1 to LS3 may have different sizes according to the size of a corresponding pixel.

The multi-viewpoint layer MLA1 in the virtual image display device DD enlarges an image output from the display panel DP. In this case, each of the lenses LS1 to LS3 of the multi-viewpoint layer MLA1 may be disposed to correspond to the pixel area PA. In this case, the pixel area PA is enlarged by the lenses LS1 to LS3, and a non-pixel area NPA is not enlarged by the multi-viewpoint layer MLA1. Accordingly, the enlargement of the non-pixel area NPA to be viewed by a user may be prevented, and, as a result, the display quality of the virtual image display device DD is not reduced.

The lenses LS1 to LS3 of the multi-viewpoint layer MLA1 may be grouped into a plurality of viewpoint units VU5 in order to provide 5 viewpoint images. Each viewpoint unit VU5 includes 5 lenses RLS, PLS1 to PLS4. As an example of the inventive concepts, each viewpoint unit VU5 includes a reference lens PLS corresponding to a reference pixel RPX, and peripheral lenses PLS1 to PLS4 corresponding to peripheral pixels PPX1 to PPX4 around the reference pixel RPX. For example, the reference pixel RPX is the first pixel PX1, and the peripheral pixels PPX1 to PPX4 may include two second pixels PX2 and two third pixels PX3 disposed around the first pixel PX1. For convenience of explanation, 4 peripheral pixels are referred to as first to fourth peripheral pixels PPX1 to PPX4, and four peripheral lenses are referred to as first to fourth peripheral lenses PLS1 to PLS4.

The central point C1 of the reference pixel RPX may match the center point C1 of the reference lens RLS. Each center point C2 of the first to fourth peripheral lenses PLS1 to PLS4 may be separated from the center point C1 of the reference lens RLS by a first interval d5. Each center point C3 of the first to fourth peripheral pixels PPX1 to PPX4 may be separated from the center point C1 of the reference pixel RPX by a second interval d6. Here, the second interval d6 may be larger than the first interval d5. In other words, each center point C3 of the first to fourth peripheral pixels PPX1 to PPX4 does not match each center point C2 of the first to fourth peripheral lenses PLS1 to PLS4. Accordingly, images output from the first to fourth peripheral pixels PPX1 to PPX4 may be refracted by corresponding peripheral lenses to be focused on one point together with an image output from the reference pixel RPX. Accordingly, 5 viewpoint images VIM1 to VIM5 may be represented by the viewpoint units VU5.

Figure 12:
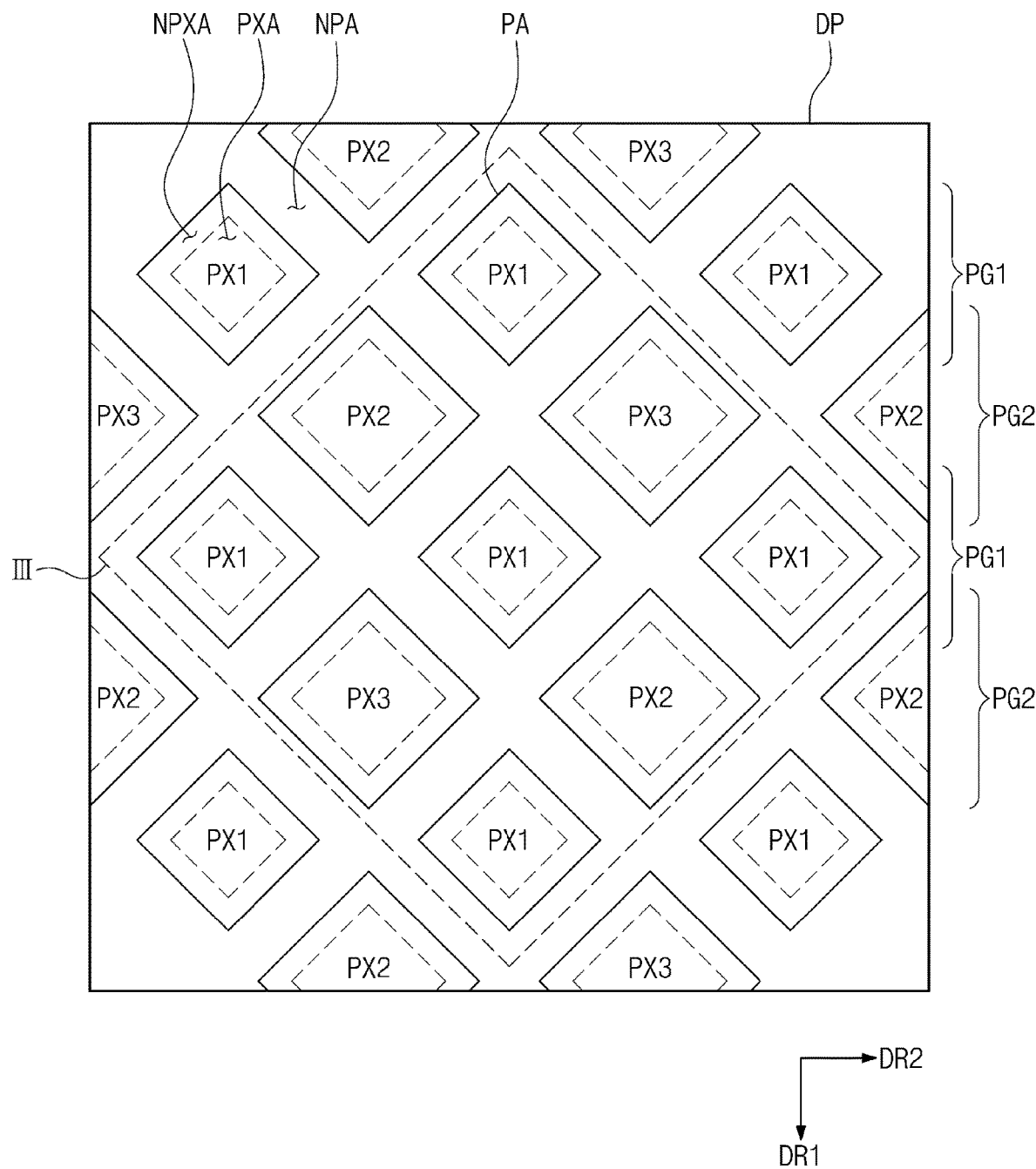
FIG. 12 is a plan view of a display panel according to an exemplary embodiment of the invention.
Figure 13:
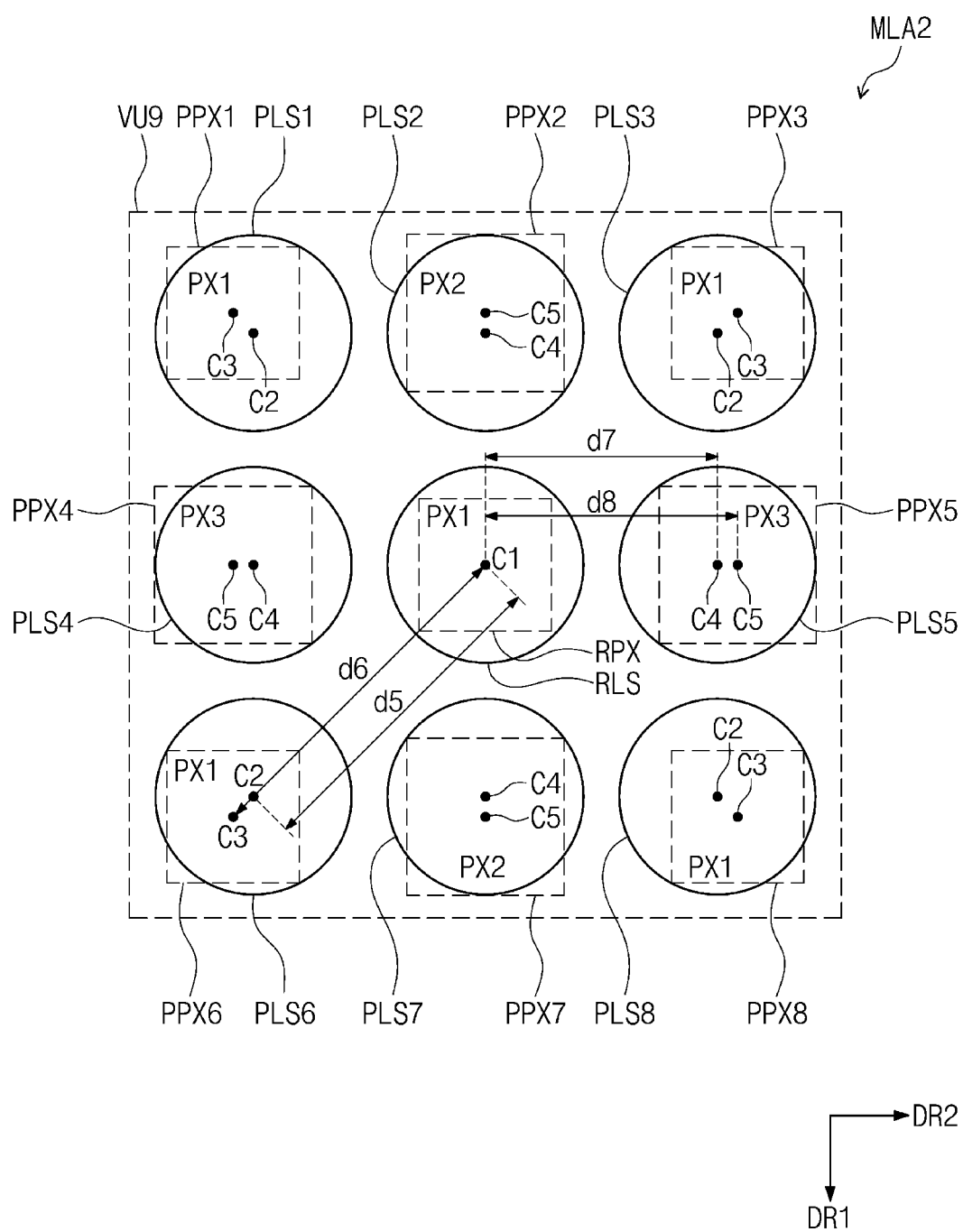
FIG. 13 is a plan view showing an arrangement relationship between pixels and lenses in region III illustrated in FIG. 12.
Figure 14:
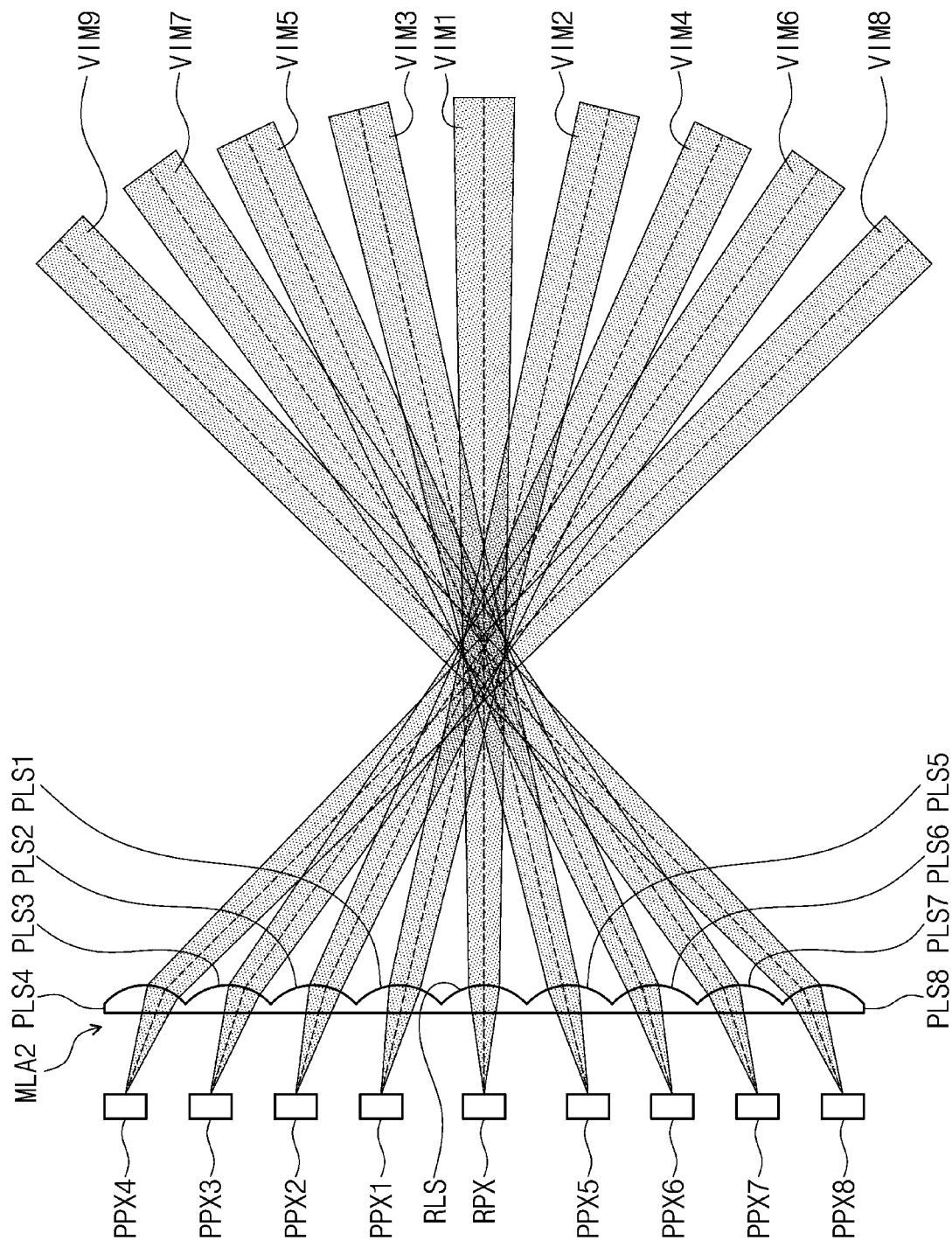
FIG. 14 illustrates an image after passing through the multi-viewpoint layer illustrated in FIG. 13.

FIG. 12 is a plan view of a display panel according to an exemplary embodiment of the invention; FIG. 13 is a plan view illustrating an arrangement relationship between pixels and lenses in region III illustrated in FIG. 12; and FIG. 14 illustrates an image after passing through the multi-viewpoint layer illustrated in FIG. 13.

Referring to FIGS. 12 and 13, a virtual image display device DD includes a multi-viewpoint layer MLA2 that may provide 9 viewpoint images.

Lenses in the multi-viewpoint layer MLA2 may be grouped into a plurality of viewpoint units VU9 in order to provide the 9 viewpoint images. Each viewpoint unit VU9 includes 9 lenses RLS, PLS1 to PLS8. As an example of the inventive concepts, each viewpoint unit VU9 includes a reference lens RLS corresponding to a reference pixel RPX, and peripheral lenses PLS1 to PLS8 corresponding to peripheral pixels PPX1 to PPX8 around the reference pixel RPX. For example, the reference pixel RPX is a first pixel PX1, and the peripheral pixels PPX1 to PPX8 may include four first pixels PX1, two second pixels PX2 and two third pixels PX3 around the first pixel PX1 which is the reference pixel RPX. For convenience of explanation, 8 peripheral pixels are referred to as first to eighth peripheral pixels PPX1 to PPX8, and 8 peripheral lenses are referred to as first to eighth peripheral lenses PLS1 to PLS8.

The central point C1 of the reference pixel RPX may match the center point C1 of the reference lens RLS. The second, fourth, fifth, and seventh peripheral lenses PLS2, PLS4, PLS5, and PLS7 may be respectively positioned in the up and down direction (namely, a first direction DR1) and the left and right direction (namely, a second direction DR2) on the basis of the reference lens RLS. The first, third, sixth, and eighth peripheral lenses PLS1, PLS3, PLS6, and PLS8 may be respectively positioned in a diagonal direction on the basis of the reference lens RLS. Here, the diagonal direction may be defined as a direction inclined with respect to the first and second directions DR1 and DR2, in detail, a direction inclined by 45 degrees with respect to the first and second directions DR1 and DR2.

Each center point C2 of the first, third, sixth, and eighth peripheral lenses PLS1, PLS3, PLS6 and PLS8 may be separated from the center point C1 of the reference lens RLS by a first interval d5. Each central point C4 of the second, fourth, fifth, and seventh peripheral lenses PLS2, PLS4, PLS5, and PLS7 may be separated from the center point C1 of the reference lens RLS by a third interval d7.

Each of the first, third, sixth, and eighth peripheral pixels PPX1, PPX3, PPX6 and PPX8 may be positioned in the diagonal direction on the basis of the reference pixel RPX, and each of the second, fourth, fifth, and seventh peripheral pixels PPX2, PPX4, PPX5, and PPX7 may be positioned in the up and down direction DR1 and the left and right direction DR2 on the basis of the reference pixel RPX. Each center point C3 of the first, third, sixth, and eighth peripheral pixels PPX1, PPX3, PPX6, and PPX8 is separated from the center point C1 of the reference pixel RPX by a second interval d6, and each center point C5 of the second, fourth, fifth, and seventh peripheral pixels PPX2, PPX4, PPX5, and PPX7 may be separated from the center point C1 of the reference pixel RPX by a fourth interval d8.

Here, the second interval d6 may be greater than the first interval d5, and the fourth interval d8 may be greater than the third interval d7. Each center point of the first to eighth peripheral pixels PPX1 to PPX8 does not match each center point of the first to eighth peripheral lenses PLS1 to PLS8. Accordingly, images output from the first to eighth peripheral pixels PPX1 to PPX8 are respectively refracted by corresponding peripheral lenses to be focused on one point together with an image output from the reference pixel RPX. Accordingly, 9 viewpoint images VIM1 to VIM9 may be represented by the viewpoint units VU9.

Figure 15:
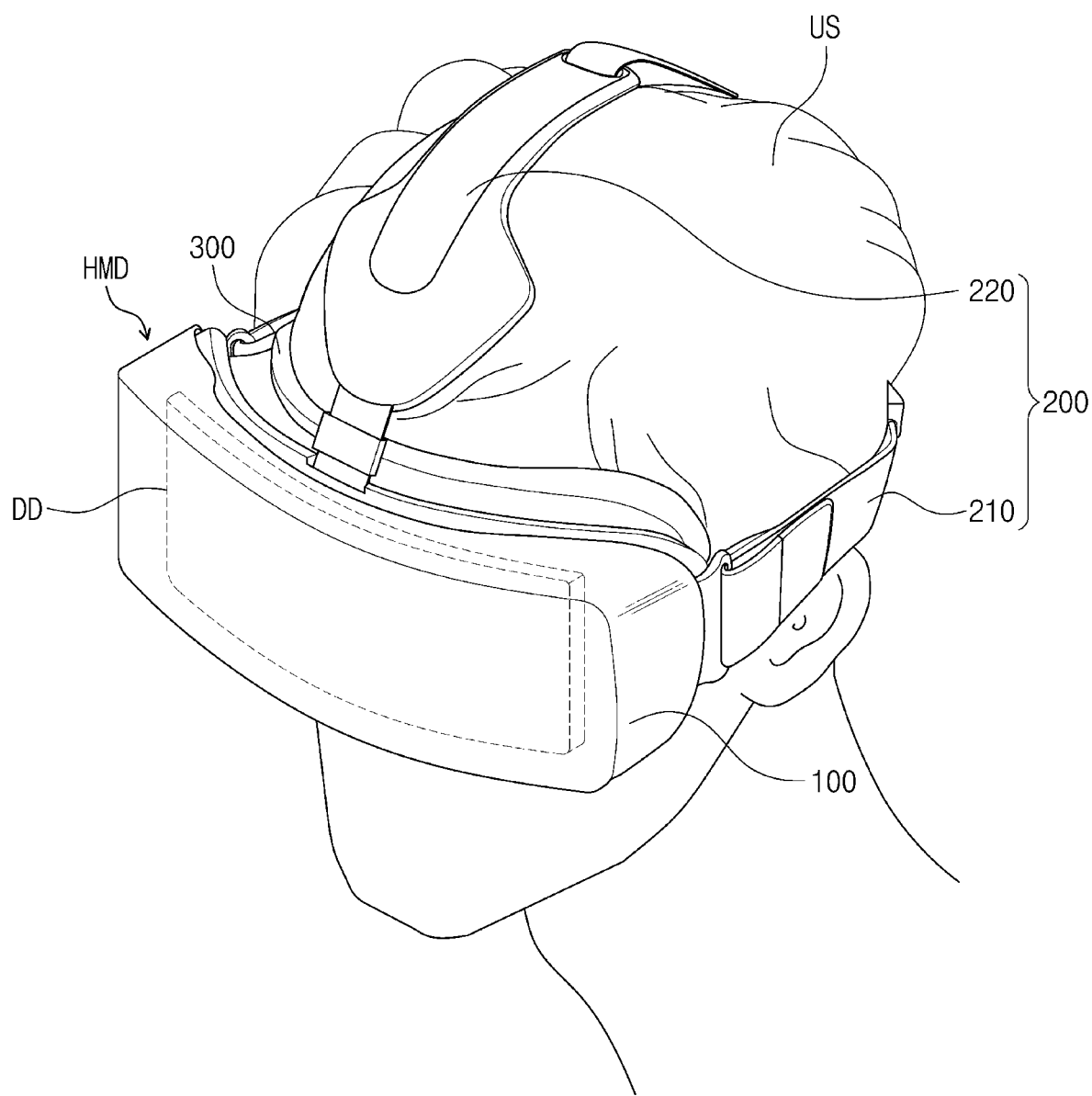
FIG. 15 is a perspective view of a head-mounted display device according to an exemplary embodiment of the invention.

FIG. 15 is a perspective view of a head-mounted device including the virtual image display device according to an exemplary embodiment of the invention.

Referring to FIGS. 1 and 15, the head-mounted device HMD is a device mounted on the head of a user US. The head-mounted device HIVID may provide an image to the user US through a virtual image display device DD in a state in which an actual peripheral view of the user US is blocked. The user US wearing the head-mounted device HMD may be more easily immersed in virtual reality through the virtual image display device DD.

The virtual image display device DD may display an image, and senses a touch input. For example, the virtual image display device DD may include at least one among a smartphone, a tablet personal computer, a mobile phone, an e-book reader, a notebook computer, a personal digital assistant, a portable multimedia player (PMP), an MP3 player, a mobile medical device, a camera, or a wearable display device.

The head-mounted device HIVID may include a frame 100, a wearing unit 200, and a cushion member 300.

The frame 100 may be mounted on the head of the user US. A seating space is provided in the frame 100, and the virtual image display device DD may be mounted in the seating space. As another example, the virtual image display device DD may be partially exposed externally in a state in which the frame 100 is mounted. The user US may control the head-mounted device HIVID using a part of the exposed virtual image display device DD.

The virtual image display device DD is provided with a multi-viewpoint layer MLA formed on the display panel DP. Accordingly, the virtual image display device DD may enlarge an image output from the display panel DP and provide the enlarged image to the user US. It is not necessary that, besides the virtual image display device DD, the head-mounted device HIVID is further provided with a separate lens module for enlarging the image output from the virtual image display device DD. Accordingly, the entire thickness of the head-mounted device HDM may be reduced.

The head-mounted device HIVID may perform communication with the virtual image display device DD. In an exemplary embodiment of the invention, the frame 100 includes a connector therein, and when the virtual image display device DD is mounted on the frame 100, the connector may be physically connected to an input terminal of the virtual image display device DD. The inventive concept is not limited thereto, and the head-mounted device HIVID and the virtual image display device DD may perform near field communication to transmit and receive a signal in a wireless manner. At this point, each of the frame 100 and the virtual image display device DD may incorporate a communication module.

Components having various functions may be embedded in the frame 100. For example, an acceleration sensor (not shown) may be embedded in the frame 100. The acceleration sensor may sense a movement of the user US, and transfer a prescribed signal to the virtual image display device DD. Accordingly, the virtual image display device DD may provide to a user US an image corresponding to a change in line of sight of the user US. In addition, a proximity sensor (not shown) may be embedded in the frame 100. The proximity sensor may determine whether the user US wears the head-mounted device HMD.

The wearing unit 200 is combined with the frame 100 to allow the user US to easily wear the frame 100. In an exemplary embodiment of the invention, the wearing unit 200 may include a main strap 210 and an upper strap 220.

The main strap 210 may be worn around the head of the user US. The main strap 210 may fix the frame 100 to the user US so that the frame 100 adheres to the head of the user US. The upper strap 220 may connect the frame 100 and the main strap 210 along the upper part of the head of the user US. The upper strap 220 may prevent the frame 100 from being slid down. In addition, the upper strap 220 may disperse the load of the frame 100 to further improve the wearing sensation felt by the user US.

In FIG. 15, a type in which the lengths of the main strap 210 and the upper strap 220 are adjustable is illustratively shown, but the inventive concept is not limited thereto. For example, in another exemplary embodiment, parts in which the main strap 210 and the upper strap 220 are elastic, i.e., the lengths of which are adjustable, may be omitted.

When the frame 100 is fixed to the user US, the wearing unit 200 may be modified in various types other than types disclosed in FIG. 15. For example, in another exemplary embodiment of the invention, the upper strap 220 may be omitted. In addition, the wearing unit 200 in another embodiment may be modified in various types such as a helmet combined with the frame 100 or temples of eyeglasses combined with the frame 100.

The cushion member 300 may be disposed between the frame 100 and the head of the user US. The cushion member 300 may be formed of a material, the shape of which being freely modified. For example, the cushion member 300 may be formed of a polymer resin (e.g., polyurethane, polycarbonate, polypropylene, polyethylene, or the like), or a sponge foamed with a rubber liquid, a urethane-based material, or an acrylic-based material. However, the inventive concept is not limited thereto.

The cushion member 300 may allow the frame 100 to be adhered to the user US to improve the wearing sensation felt by the user US. The cushion member 300 is detachable from the frame 100. The cushion member 300 in another exemplary embodiment of the invention may be omitted.

A virtual image display device according to the inventive concepts includes a multi-viewpoint layer directly provided on an uppermost surface of a display panel. As a result of the multi-viewpoint layer directly provided on the display panel, the size of each lens provided in the multi-viewpoint layer may be reduced to a pixel size, and the distance between the lens and a pixel may be reduced. Accordingly, the entire thickness of the head-mounted device, which employs the virtual image display device, may be reduced.

A phenomenon in which a non-emission area is viewed as enlarged may be prevented by placing lenses so as to correspond to an emission area among pixel areas of the display panel, and thereby improve the quality of an image.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A virtual image display device comprising:
a display panel including a plurality of pixels;
a window disposed on the display panel; and
a multi-viewpoint layer provided between the display panel and the window, the multi-viewpoint layer comprising a plurality of lenses,
wherein:
the display panel comprises a plurality of pixel areas in which a plurality of pixels are respectively disposed, and non-pixel areas disposed between the plurality of pixel areas;
the plurality of lenses are disposed to correspond to the plurality of pixel areas on a one-to-one basis, respectively;
the multi-viewpoint layer comprises a plurality of viewpoint units;
each of the plurality of viewpoint units comprises N lenses among the plurality of lenses to provide N viewpoint images, where N is an integer greater than 2;
the N lenses comprise a reference lens and (N-1) peripheral lenses;
a center point of the reference lens matches a center point of a reference pixel corresponding to the reference lens; and
center points of the (N-1) peripheral lenses are disposed at different positions from center points of peripheral pixels respectively corresponding to the (N-1) peripheral lenses such that images output from the peripheral pixels are refracted by the corresponding (N-1) peripheral lenses to be focused on one point together with an image output from the reference pixel.

2. The virtual image display device of claim 1, wherein:
each of the plurality of pixel areas comprises:
a light emission area; and
a non-light emission area adjacent to the light emission area; and
each of the plurality of lenses is disposed in the light emission area of a corresponding pixel.

3. The virtual image display device of claim 2, wherein each of the plurality of pixels comprises an organic light emitting element including a light emission layer disposed to correspond to the light emission area.

4. The virtual image display device of claim 1, wherein:
the display panel further comprises a thin-film encapsulation layer covering the plurality of pixels; and
the multi-viewpoint layer is disposed on a top surface of the thin-film encapsulation layer.

5. The virtual image display device of claim 1, wherein a distance between a lens and a pixel corresponding to each other is in a range of about 10 μm to about 450 μm.

6. The virtual image display device of claim 1, wherein each of the plurality of lenses has a height in a range of about 1 μm to about 20 μm.

7. The virtual image display device of claim 1, wherein each of the plurality of lenses has a pitch smaller than a size of each of the plurality of pixels.

8. The virtual image display device of claim 1, wherein each of the plurality of lenses has a radius of curvature in a range of about 5 μm to about 20 μm.

9. The virtual image display device of claim 1, further comprising an adhesive layer between the multi-viewpoint layer and the window.

10. The virtual image display device of claim 1, further comprising at least one of a functional layer and a protection layer disposed between the multi-viewpoint layer and the window.

* * * * *